United States Patent [19]

Forster et al.

[11] Patent Number: 5,516,403
[45] Date of Patent: May 14, 1996

[54] REVERSING ORIENTATION OF SPUTTERING SCREEN TO AVOID CONTAMINATION

[75] Inventors: John Forster, San Francisco; James S. Van Gogh, Sunnyvale; Avi Tepman, Cupertino, all of Calif.

[73] Assignee: Applied Materials, Santa Clara, Calif.

[21] Appl. No.: 357,695

[22] Filed: Dec. 16, 1994

[51] Int. Cl.⁶ .................................................. C23C 14/34
[52] U.S. Cl. .................. 204/192.12; 204/298.11
[58] Field of Search .................. 204/192.12, 298.09, 204/298.01, 298.02

[56] References Cited

U.S. PATENT DOCUMENTS 5,223,108  6/1993  Hurwitt ........................... 204/192.12

FOREIGN PATENT DOCUMENTS 0067016    4/1983   Japan .................. 204/298.11
3202466    9/1991   Japan .................. 204/298.11
405326426 12/1993   Japan .................. 204/298.11

*Primary Examiner*—Nam Nguyen
*Attorney, Agent, or Firm*—Donald Verplancken; B. Todd Patterson; Jeffrey L. Streets

[57] ABSTRACT

A sputtering apparatus deposits a layer of material on a substrate. The apparatus includes a screening member, such as a plate collimator or a tube collimator, located between the target and substrate. A motor drive reverses the respective positions of the two opposite sides of the screening device which respectively face the substrate and the target.

16 Claims, 1 Drawing Sheet

5,516,403

REVERSING ORIENTATION OF SPUTTERING SCREEN TO AVOID CONTAMINATION

BACKGROUND OF THE INVENTION

1. Field of the Invention

The present invention relates to the deposition of material onto a semiconductor substrate using sputtering apparatus having a mechanical filter or screen for controlling the directionality of the material as it is deposited, such as a collimator plate or collimator tube. More particularly, the invention relates to reducing contamination caused by material which deposits on the filter or screen and then dislodges.

2. Background of the Prior Art

Sputtering is one well known method of depositing a film layer on a semiconductor substrate. A typical sputtering apparatus includes a target and a substrate support pedestal enclosed in a vacuum chamber. The target is typically affixed to the top of the chamber, but is electrically isolated from the chamber walls. A voltage source maintains the target at a negative voltage with respect to the walls of the chamber, thereby exciting a gas, which is maintained in the chamber at a low pressure, into a plasma. Ions from this plasma sputter the target.

As a first order approximation, the trajectories of the particles sputtered from any point on the target have a cosine angular distribution; that is, the density of sputtered particles ejected from a point on the target along a trajectory having a given angle from perpendicular to the target is proportional to the cosine of such angle. The target particles sputtered from the target generally travel in a straight line path and will tend to deposit on any surface that they contact.

One application of sputtering is to provide a conformal metal deposition layer on the surfaces of holes and trenches extending through one or more metal, dielectric or semi-conducting film layers on the uppermost surface of the substrate. The metal deposited on the substrate by sputtering the target must form a continuous, i.e., conformal, coating on the wall and base of the holes or trenches.

The uniformity of the film layer deposited on the wall and base of each hole or trench is dependent on the angular distribution of the trajectories of the individual particles of target material reaching each of the holes or trenches. Particles travelling in paths that are substantially perpendicular to the substrate surface will pass through the open end of the hole or trench and deposit on the hole or trench base. Particles travelling at angles from perpendicular to the substrate surface will typically deposit on the hole wall, at the intersection of the hole wall and base, and at the upper surface of the substrate adjacent to the hole opening.

One means of providing uniform symmetric coverage of the holes requires collimation of the target material flux, such as with a target particle screening or blocking device. For example, as disclosed in U.S. Pat. No. 4,824,544, Mikalesen, et al., one method of collimating the flux is to locate a screening device such as a plate collimator having a plurality of relatively small holes therethrough between the substrate and the target. The holes have a ratio of length to diameter sufficient to screen target particles travelling in paths which are substantially oblique to the upper surface of the substrate from the flux of target particles passing through the plate collimator. The screening is provided because the obliquely travelling particles deposit on the wall of the collimator holes. Because the portion of the flux travelling obliquely to the substrate surface is screened out, the flux reaching the substrate has a distribution of trajectory angles close to perpendicular to the substrate.

One problem commonly associated with plate collimators is the formation of loosely attached deposits on the underside of the collimator and on the lower reaches of the collimator apertures. These deposits form when a target particle collides with the collimator surface at low kinetic energy. On the underside of the physical collimation device, the deposits are primarily created when target particles collide with another particle within the chamber but continue moving in an altered, low velocity, trajectory, which brings them in contact with the underside of the collimator. In the lower reaches of the collimator apertures, these deposits form when target particles collide with the aperture wall at a low angle trajectory. At the target end of the apertures, a large flux of particles traveling at large angles with respect to the wall surface are present and these particles impact the wall at sufficient energy to cover, or incorporate, any loosely attached deposits which form at the upper end of the aperture wall. However, at the end of the aperture wall located adjacent to the substrate, the surface of the collimator adjacent to the target blocks the target particles travelling at large angles with respect to the aperture wall. Therefore, the deposit at this location is primarily formed from particles travelling substantially obliquely to the aperture wall, which, when deposited, form loosely attached particles on the collimator surface.

SUMMARY OF THE INVENTION

The present invention provides apparatus and methods for eliminating, or substantially reducing, the possibility that deposits formed on a target particle screening device (such as a collimator plate or collimator tube) will dislodge from the walls of the screening device aperture(s) and fall onto the semiconductor substrate. According to the invention, the orientation of the screen device is periodically reversed, so that the end of the device formerly facing the target then faces the substrate, and vice versa.

The invention exploits the fact that the material sputtered off the target and striking the end of the screen facing the target tends to have higher energies than the material striking the end of the screen facing the substrate. Therefore, the material which deposits near the target end of the screen tends to adhere well to the screen, but the material which deposits near the substrate end of the screen tends to flake off or otherwise become dislodged, so that it can fall on and contaminate the substrate.

By reversing the two ends of the screen, the loosely bound material deposited on the substrate end of the screen becomes coated by high energy bombardment of material which forms a strongly adhering, ovelying layer, thereby preventing or minimizing any dislodging of material from the screen.

DETAILED DESCRIPTION OF THE PREFERRED EMBODIMENTS

Figure 1:
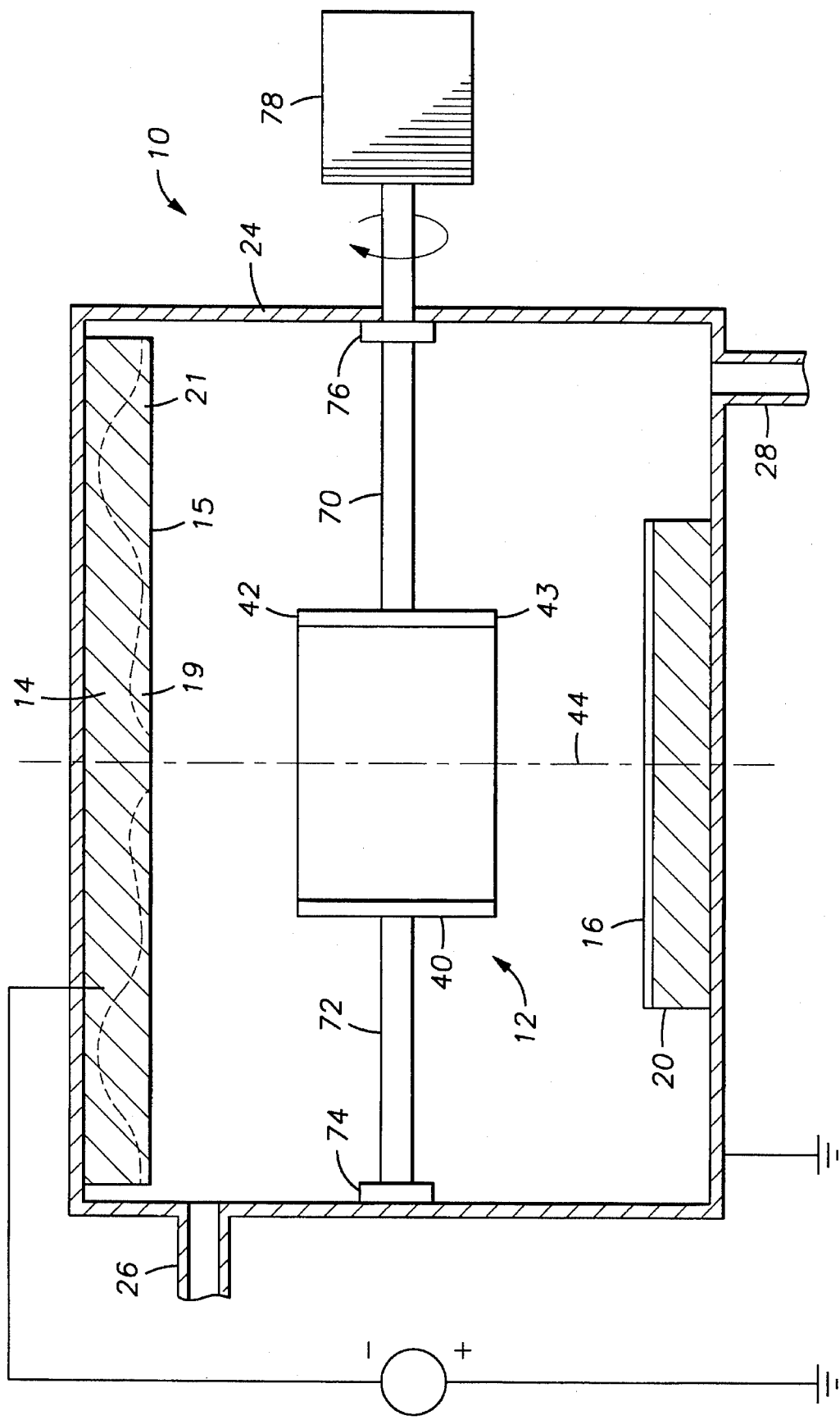
FIG. 1 is a diagrammatic illustration, in section, of the essential portions of a sputtering apparatus employing the present invention.

The sputtering apparatus and method of the present invention generally contemplates the placement of a target particle screening device, such as a collimator, between the target 14 and the substrate 16 in a sputtering chamber 10, and periodically reversing the orientation of the screening device to alternately expose the top surface and bottom surface thereof to the sputtering target. By alternately exposing the top and bottom surfaces of the screening device to the target 14, both the top and bottom surfaces of the screening device will receive a flux of high energy particles which will incorporate, or encapsulate, any loosely attached particles previously deposited thereon.

CONVENTIONAL PORTIONS OF THE SPUTTERING CHAMBER

Referring still to FIG. 1, the vacuum chamber 10 for practicing our invention generally includes a chamber enclosure wall 24, having at least one gas inlet 26 and an exhaust outlet 28 connected to an exhaust pump (not shown). A substrate support pedestal 20 is disposed at the lower end of the chamber 10, and a target 14 is mounted to the upper end of the chamber 10. The target 14 is electrically isolated from the enclosure wall 24 and the enclosure wall 24 is preferably grounded, so that a negative voltage may be maintained on the target 14 with respect to the grounded enclosure wall 24. In operation, the substrate 16 is positioned on the support pedestal 20.

During the deposition process a gas, typically a non-reactive species such as Ar, is charged into the vacuum chamber 10 through the gas inlet 26 at a selected flow rate regulated by a mass flow controller. The chamber pressure is controlled by throttling the rate at which chamber gases are pumped through the exhaust outlet 28.

A D.C. power supply applies a negative voltage to the target 14 with respect to the enclosure wall 24 so as to excite the gas into a plasma state. Ions from the plasma bombard the target 14 and sputter atoms and larger particles of target material from the target 14. The particles sputtered from the target 14 travel from the target 14, and a portion of the particles deposit on the substrate 16.

A conventional magnetron sputtering source employs a magnet (not shown) above the target 14 to increase the concentration of plasma ions adjacent to the sputtering surface of the target 14, and particularly in one or more annular regions intermediate the center and the perimeter of the target 14. Conventionally, a target 14 newly installed in the chamber has a planar sputtering surface 15 facing the substrate 16 as shown in FIG. 1. As substrates are sequentially processed with the target 14, the sputtering surface 15 takes on the erosion profile 19,21 as shown in phantom in FIG. 1, wherein a minor enhanced annular sputtering region 19 and a major enhanced annular sputtering region 21 are provided by the magnet structure.

PLACEMENT OF THE TARGET PARTICLE SCREENING DEVICE BETWEEN THE TARGET AND THE SUBSTRATE

In the preferred embodiment of the invention, the target particle screening device is a tube 12 placed between the target 14 and the substrate 16 as shown in FIG. 1. The tube 12 is a hollow cylinder having a thin annular wall 40 and a first end 42 initially located adjacent and exposed to the target 14, and a second end 43 initially located adjacent and exposed to the semiconductor substrate 16. Both the inner and outer surfaces of the tube 12 wall 40 block particle trajectories from selected regions of the target 14 toward selected regions of the substrate 16. Consequently, the screening tube 12 blocks a large portion of the particles traveling at substantially oblique (i.e., non-perpendicular) angles toward the substrate. Additionally, the screening tube enhances the symmetry of deposition on the inner and outer walls of holes near the periphery of the substrate, and it improves the uniformity of deposition between the center and edge of the substrate. The tube design is described in detail in a commonly owned U.S. patent application 08/357, 001, pending, filed concurrently herewith entitled "Cylindrical Sputtering Shield" by Avi Tepman.

The tube 12 material must be selected to be non-contaminating to the semiconductor substrate when exposed to a plasma. Therefore, the tube 12 is preferably manufactured from the same material as the target 14.

The tube 12 is preferably supported in the chamber 10 between the substrate 16 and target 14 on opposed co-linear rods 70 and. 72, which are connected to the tube wall 40 approximately 180° apart, midway between the upper annular end 42 and lower annular end 43 of the tube 12. The rod 72 is mounted to the chamber wall 24 through a sealed rotary coupling 76, and the rod 70 extends from the tube wall 40 and through a second sealed rotary coupling 76 in the chamber wall 24. A motor 78 is attached to the end of the rod 70 outwardly of the chamber 10, to selectively rotate the tube 12 as will be further described herein.

ROTATING THE TUBE TO AVOID DISLODGING PARTICLES

During the deposition process, a portion of the material sputtered from the target 14 will deposit on the first annular end 42, second annular end 43 and the inner and outer surfaces of wall 40 of the tube 12. When the tube 12 is positioned as shown in FIG. 1, the particles which deposit on the annular end 43 and on the inner and outer surfaces of the tube wall 40 closest to the substrate 16 will typically engage the tube 12 at low impact energies. When the target particles deposit on a surface with low impact energy they may form loosely attached powdery deposits on the deposition surface. These loosely attached deposits may later flake off the tube 12 surface and contaminate the substrate 16. Therefore, any object placed between the substrate 16 and the target 14, such as the tube 12, must be periodically cleaned to remove the material deposited on the surfaces thereof at low energies to ensure that deposits do not flake off and contaminate a substrate 16.

In our invention, the need for periodically cleaning the collimator or other screening device is markedly reduced by periodically flipping the tube 12 from end to end, thereby periodically reversing the positions of the second annular end 43 and the first annular end 42 of the tube with respect to the target 14. Each flip of the robe is accomplished by activating the motor 78 to rotate the collimator tube 180° about the axles 70,72. Preferably, the sputtering process is paused during the time required to flip the tube.

Immediately before the collimator tube is flipped, the inner and outer walls of the robe 40 near the end 43 adjacent the substrate will be at least partially coated by loosely attached deposits that pose a risk of dislodging from the walls and falling onto the semiconductor substrate. In contrast, the material deposited on the tube walls near the opposite end 42 adjacent the target generally adhere well to the walls because they had struck the walls with greater energy when they were deposited.

After the motor flips the collimator or screening tube 40, the end of the tube having the loosely attached deposits will be adjacent the target. As soon as the sputter deposition process resumes following the flip, the loosely attached deposits progressively will be covered by new deposits which firmly adhere to the tube because they are composed of particles striking the tube walls with high energies. Conversely, after the flip, the end of the tube formerly having well adhering deposits progressively will be covered by new, loosely adhering deposits.

If the motor periodically flips the collimator tube 40 before the loosely adhering deposits near the end of the tube adjacent the substrate have accumulated to the point where they begin to flake off or otherwise become dislodged, then each layer of loosely adhering deposits will be covered by a subsequent layer of strongly adhering deposits, thereby reducing to negligible levels any risk of particles from the collimator or screen tube 40 contaminating the semiconductor substrate.

The invention eliminates the need to periodically clean the collimator tube or screening device to prevent the dislodging of deposits that can contaminate the semiconductor substrate. This is important because cleaning requires halting the deposition process performed in the sputtering chamber, thereby reducing the production throughput of the chamber. However, cleaning eventually will continue to be required when deposits accumulate to such an extent that they significantly narrow the apertures at the ends 42 and 43 of the collimator. A considerable thickness of deposits can accumulate before this condition is reached, hence such cleaning can be performed much less frequently than the cleaning required in prior art sputtering apparatus in which dislodging of deposits from the collimator is a much greater problem.

The tube 12 may be flipped (by operating the drive motor 78 to rotate the axle 70 by 180°) one or more times during the deposition of a material layer on a single substrate, or, if desired, it may be flipped after every N substrates 16 are processed in the chamber 10, where N is any predetermined number. Preferably, the collimator tube assumes each of the two possible orientations (i.e., first end 42 up and first end 42 down, respectively) for equal periods of time over the life of the tube 12.

This method of extending the time between cleanings of the tube 12 may be applied to any target particle screening device, such as the tube nest or perforated plate collimator structure of Mikalesen, et al, U.S. Pat. No. 4,824,544 previously incorporated herein by reference.

In sputtering chambers in which there is insufficient clearance to rotate the target particle screening device without striking the target 14, the substrate support 20, or another chamber component—such as chambers in which the diameter of the screening device exceeds the distance between the target 14 and the substrate 16—it is specifically contemplated that a secondary chamber (not shown) may be connected to the sputtering chamber 10 through a slit valve, and that the screen 40 may be retracted from the chamber 10 and into this secondary chamber to enable rotation of the device without interference, and then the screen can be returned to the sputtering chamber.

The present invention enables the use of target particle screening devices to improve the symmetry of the deposition layer without the frequent maintenance associated with the prior art target particle screening devices necessitated by the need to remove loosely attached deposits from the device before they contaminate a substrate.

We claim:

1. A sputtering chamber for depositing material on a semiconductor substrate, the chamber comprising:

a sputtering target;

a substrate support for receiving a semiconductor substrate thereon;

a target flux screening member, positioned between the target and the substrate support, having first and second opposite sides and having at least one opening extending between said first and second sides; and a motor drive mechanism, coupled to said target flux screening member, for orienting the screening member so that the first and second sides face the target and the substrate support, respectively in a first orientation, and for subsequently reversing the orientation of the screening member so that the first and second sides face the substrate support and the target, respectively in a second orientation.

2. The sputtering chamber of claim 1, wherein said motor drive mechanism includes an axle extending from said target flux screening member; and a motor connected to the axle so that the rotation of the axle by the motor changes the orientation of the screening member from the first orientation to the second orientation.

3. The sputtering chamber of claim, wherein said first and second sides have a common axis of symmetry; and said axle is perpendicular to the axis of the first and second sides.

4. The sputtering chamber of claim 1, wherein said screening member is a tube.

5. The sputtering chamber of claim 1, wherein said screening member is a plate collimator.

6. The sputtering chamber of claim 1, wherein said motor drive mechanism alternates positions of said first side and said second side after each substrate is processed in the chamber.

7. The sputtering apparatus of claim 1, wherein said motor drive mechanism alternates the positions of said first side and said second side after every predetermined number of substrates is processed in the chamber.

8. The sputtering apparatus of claim 1, wherein said motor drive mechanism alternates the positions of said first side and said second side between two deposition steps performed on the substrate in the chamber.

9. A method of sputter depositing material on a semiconductor substrate, comprising:

providing a sputtering target and a semiconductor substrate within the chamber;

positioning a target flux screening member between the target and the substrate support, said screening member having first and second opposite sides and having at least one opening extending between said first and second sides;

initially orienting the screening member so that the first and second sides face the target and the substrate support, respectively; and then subsequently orienting the screening member so that the first and second sides face the substrate support and the target, respectively.

10. The method of claim 9, wherein the positioning step includes attaching the screening member to an axle; and the subsequent orienting step includes rotating the axle.

11. The method of claim 9, further including the step of periodically reversing the orientation of the first and second sides of the screening member by periodically performing either the initial orienting step or the subsequent orienting step, in alternation.

12. The method of claim 11, wherein the periodically reversing step further includes reversing the orientations of the first and second sides after each substrate is processed in the chamber.

13. The method of claim 11, wherein the periodically reversing step further includes reversing the orientations of the first and second sides after a predetermined number of substrates is processed in the chamber.

14. The method of claim 11, further comprising the steps of:

after the initial orienting step, sputter depositing material on the substrate; and after the subsequent reversing step, sputter depositing additional material on the substrate.

15. The method of claim 9, wherein the screening member is a tube.

16. The method of claim 9, wherein the screening member is a plate collimator.

* * * * *